United States Patent [19]

Nowell

[11] Patent Number: 4,864,591
[45] Date of Patent: Sep. 5, 1989

[54] FACSIMILE SIGNAL MODULATION DETECTOR

[75] Inventor: Scott Nowell, Brookline, N.H.

[73] Assignee: Alden Electronics, Inc., Westboro, Mass.

[21] Appl. No.: 146,951

[22] Filed: Jan. 22, 1988

[51] Int. Cl.[4] ............................................. H03K 9/00
[52] U.S. Cl. ....................................... 375/78; 375/94; 358/443; 329/341; 329/347
[58] Field of Search ............................. 375/22, 78, 94; 358/280, 281; 329/106, 104; 340/825.63, 825.57

[56] References Cited

U.S. PATENT DOCUMENTS

| | | | |
|---|---|---|---|
| 3,489,853 | 1/1970 | Lang | 375/22 |
| 3,600,680 | 8/1971 | Maniere et al. | 375/78 |
| 3,828,263 | 8/1974 | Blomenkamp | 375/22 |

Primary Examiner—Robert L. Griffin
Assistant Examiner—Marianne Huseman
Attorney, Agent, or Firm—James H. Grover

[57] ABSTRACT

Electronic apparatus for receiving amplitude or frequency modulated facsimile signals detects the instantaneous value (i.e., the amplitude or frequency) of the modulation by a circuit including means detecting the modulation value in each cycle of the signal and producing a gating signal corresponding in duration to the detected modulation value, a generator of clock pulses higher in frequency than the signal, and a modulator responsive to the clock pulse and gating signal to pass a number of clock pulses commensurate with the modulation value to a counter which generates a marking signal commensurate in amplitude to the modulation value for application to a facsimile recorder.

12 Claims, 2 Drawing Sheets

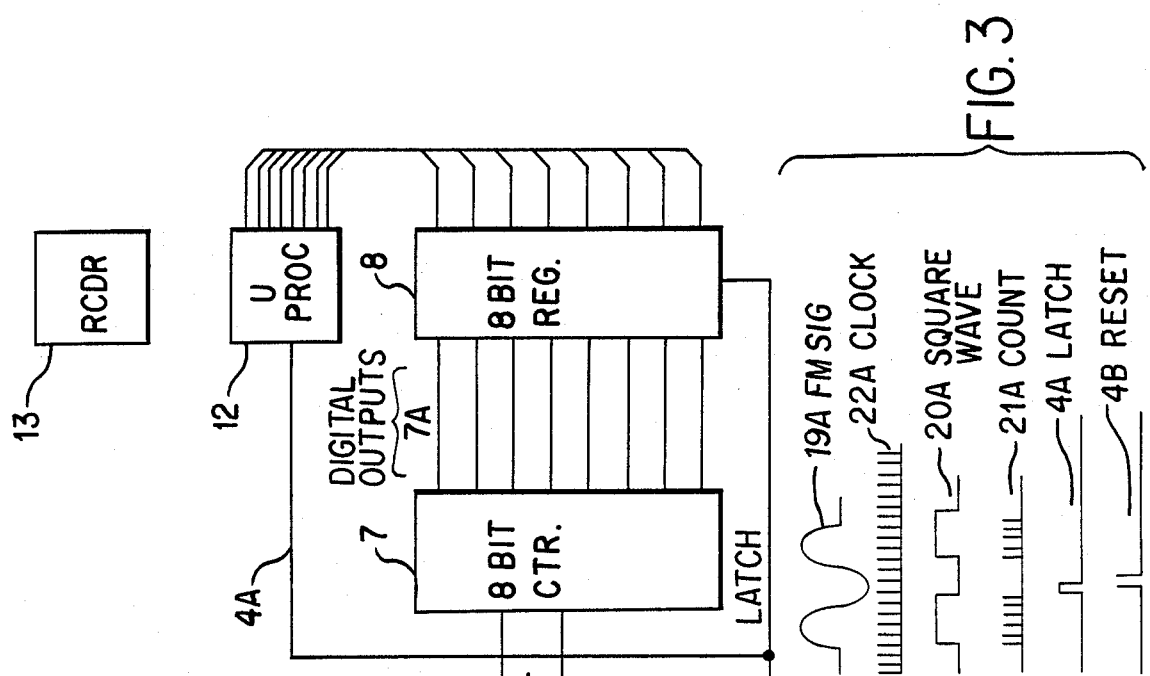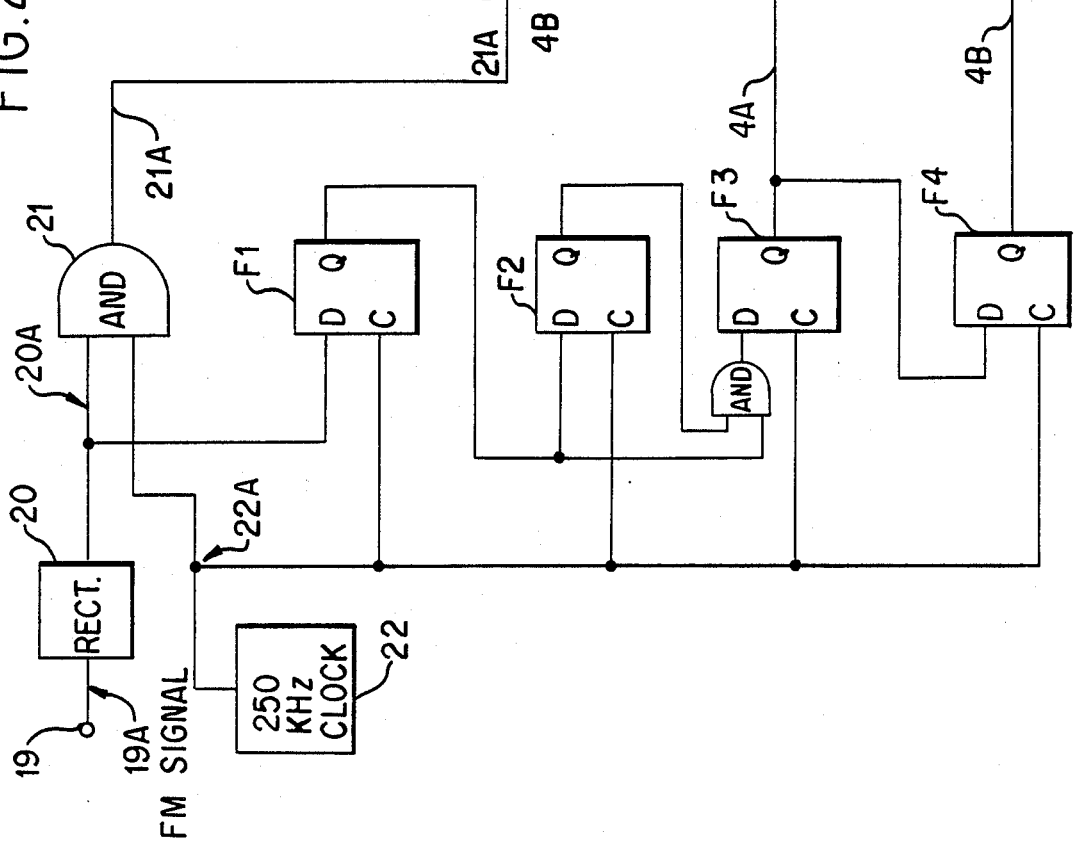

FACSIMILE SIGNAL MODULATION DETECTOR

BACKGROUND OF THE INVENTION

Graphic facsimile signals are transmitted both by amplitude modulation (AM) and frequency modulation (FM). In either case the successive instantaneous values of the modulation, that is the amplitude in volts or the frequency in hertz, are detected and used to generate a marking signal applied to a facsimile recorder. Conventional AM and FM detectors have sampled and capacitatively held a number of cycles of the transmitted signal in the process of measuring the amplitude or frequency value. But capacitative circuit components inherently introduce a delay in the detection process, whereas the speeds of facsimile signal transmission and recording are increasing.

It is therefor the object of the present invention to provide electronic apparatus which eliminates capacitative circuitry and the need for sampling multiple cycles of a modulated signal to determine the amplitude or frequency value of its modulation.

SUMMARY OF THE INVENTION

According to the invention electronic apparatus for detecting the modulation value of a cyclic facsimile signal comprises an input receiving the modulated cyclic signal, means for detecting a significant portion of each signal cycle exhibiting the modulation value to produce a gating voltage wave correponding in duration to the modulation value, a generator of pulses substantially higher in frequency than the cycles of the input signal, a modulator connected to the pulse generator and detecting means and responsive thereto to gate a number of higher frequency pulses for the duration of the gating voltage wave, means coupled to the modulator for counting the number of gated pulses to generate a marking signal whose amplitude is commensurate with the modulation value, and means coupled to the counting means for applying the marking signal to a facsimile recorder.

DRAWINGS

FIG. 2 is a circuit diagram of a frequency modulated facsimile signal detector; and FIG. 3 is a graph of voltage waveforms in the circuit of FIG. 2.

DESCRIPTION

Figure 1:
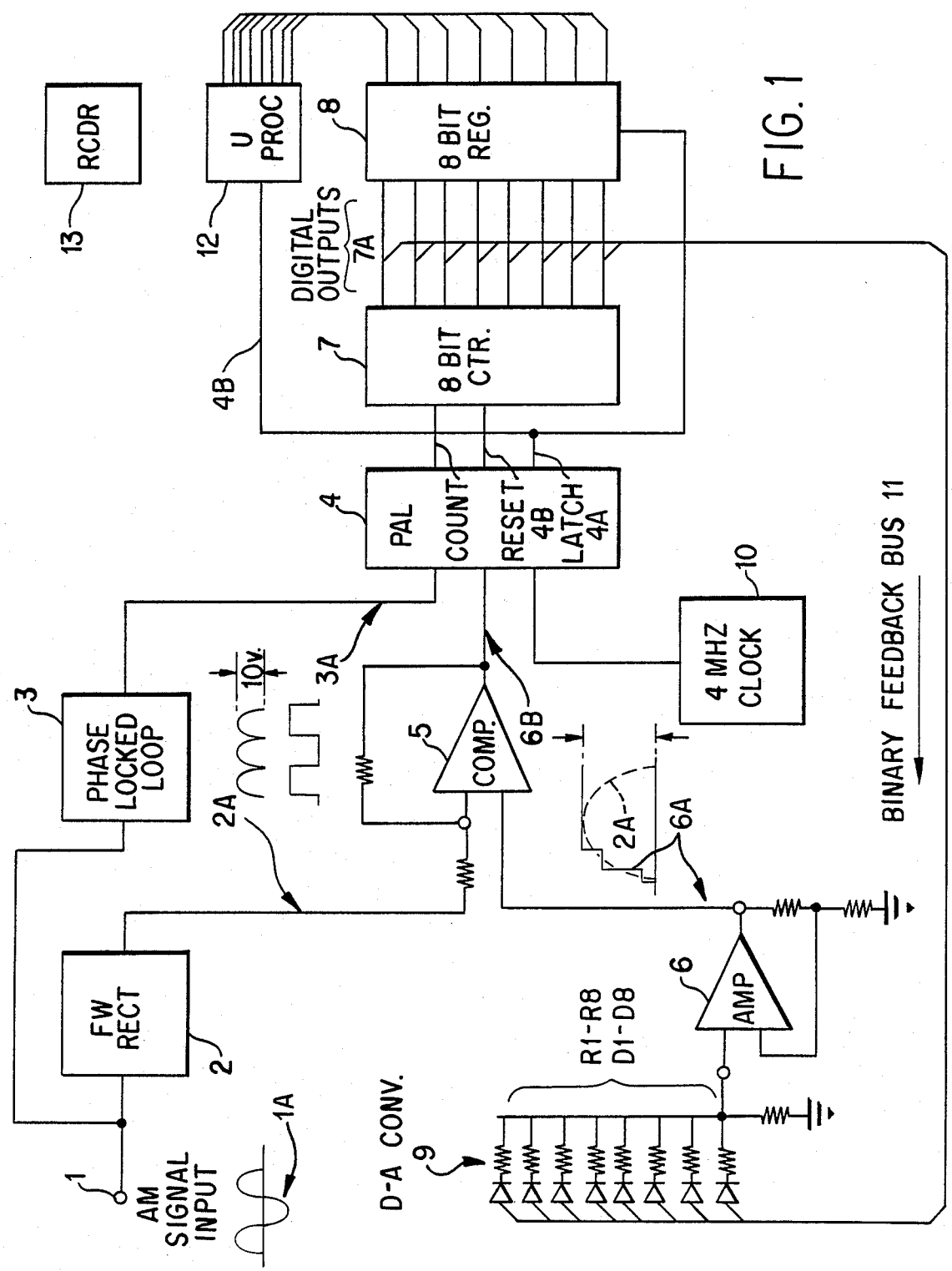
FIG. 1 is a circuit diagram of an amplitude modulated facsimile signal detector according to the invention.

FIG. 1 of the drawings shows schematically electronic apparatus for processing amplitude modulated (AM) facsimile signals for application to a facsimile recorder. Amplitude modulated facsimile signals 1A are received at an input terminal 1 of a full wave rectifier 2 which produces successive half cycle waves 2A of the same polarity and corresponding to the input signal amplitude. The rectified half waves 2A are applied to a comparator 5. The comparator 5 may be a type LM339 operational amplifier, available from National Semiconductor Corporation, Santa Clara, Calif., which comprises means for detecting the peak voltage amplitude of each rectified half cycle by comparison of the instantaneous amplitude of the half cycle with that of a step voltage wave form 9A generated by a digital to analog converter 9.

When the peak voltage of each half wave is reached, the voltage signal is then applied from the comparator to a suitably programmed programmable array logic (PAL) integrated circuit 4, such as type PAL 16R6 available from Monolithic Memories, Santa Clara, Calif., and causes the PAL to gate a number of pulses generated by a clock 10, the number of pulses being proportional to the peak voltage amplitude of the half cycle. The constant pulse rate of the clock should be substantially higher than that of the AM input signal, a clock rate of 4 Mhz being suitable with the standard AM carrier of facsimile signals.

The gated pulses are counted by an 8-bit counter 7 (e.g., type SN74LS593) which converts the peak voltage of the half wave signal into a control signal expressed in binary digital code at the eight outputs 7A of the counter. This binary coded output control signal is applied to an 8-bit register 8 (e.g., type 74LS374) and through a feedback bus 11 to the digital to analog converter 9.

The converter 9 comprises a ladder circuit of resistors R1 to R8 with values of the powers of two between 1 and 128 kilohms. Applying the digitally coded voltage 7A from the the 8-bit counter 7 causes the converter to generate a step voltage 6A, after amplification by an amplifier 6 (e.g., Texas Instruments Co. type TL072). The comparator determines whether, at any instant, the step voltage 6A is greater or less than the half wave signal 2A. If the step voltage is less than the instantaneous half wave voltage the comparator 5 signals the PAL 4 to gate clock signals to the counter 7. The binary output of the counter, fed back through the bus 11 through blocking diodes D1 to D8 to respective resistors in the resistor ladder 9, results in an increase in its output voltage 6A until the instantaneous half wave voltage 2A is exceeded, at which time feedback to the ladder stops and the step voltage remains constant until again exceeded by the half wave voltage. This tracing of the half wave voltage by the step voltage continues in smaller increments than can be shown in the drawing until the half wave voltage reaches its peak and no longer exceeds the step voltage so that the comparator puts out a steady gating voltage. The step voltage then holds its voltage substantially at the peak half wave voltage regardless of whether that peak occurs at the quarter cycle as in a pure sine wave, or earlier or later in the half cycle in the case of sawtooth or other asymmetric waveforms. The determination of the input signal peak voltage is thus independent of the shape of the wave form, and dependent only on the significant portion of the AM signal cycle between its start and the peak of the first half cycle. No substantially capacitative components are used in the above described amplitude modulation detection circuit.

The gating signal from the comparator causes the PAL to gate a number of clock pulses commensurate with the half wave peak voltage. This voltage converted to a control signal 7A in binary digital code by the counter 7 is stored in the 8 bit register 8 for application later in the same cycle of the input signal to a microprocessor 12 which converts the control signal representing instantaneous peak signal voltage into analog or other form suitable for application to a facsimile recorder 13 for marking a web such as thermosensitive paper.

The phase locked loop 3 (type NE 565, e.g.) responds to the AM input signal 1A to generate a square wave signal 3A for each full AM cycle and apply the square wave signal to the PAL 4 which generates a LATCH signal 4A applied to the 8 bit register 8 and the microprocessor 12. The PAL also generates a RESET signal 4B immediately after latch. The output of the counter 7 is latched into the register 9 by the LATCH signal 4A. The LATCH signal also notifies a microprocessor 12 that data is available in the register. The RESET signal 4B clears the output of the counter to zero prior to resumption of counting in the following half cycle. The binary digital output 7A of the counter 7 latched into the register is read by the microprocessor 12 which generates a marking signal of amplitude commensurate with the detected AM half wave signal amplitude. The marking signal is applied to a facsimile recorder 13, preferably of the type with a thermal print head.

FIGS. 2 and 3 illustrate a system for processing frequency modulated facsimile signals consisting of an input terminal 19 for full wave frequency modulated signals 19A which are converted by a conventional half wave rectifier and clipper 20 to square wave voltage form 20A shown in FIG. 3 which corresponds in duration to the interval of the half cycle of the frequency modulated input signal. The square voltage wave 20A is applied to an AND gate 21 (e.g., Texas Instruments Co. type SN74LS08). Also applied to the AND gate 21 are 250 kilohertz voltage pulses generated by a clock oscillator 22. The AND gate 21 acts as a modulator passing the clock pulses for the duration of each half cycle square voltage wave 20A to the COUNT input of an 8 Bit counter 7 like that of FIG. 1. Preferably the operation of the above described gating and flip flop circuit is performed by a correpondingly programmed programmable logic device (PLD) such as type PAL 16R6 avalilable from Monolithic Memories.

The square voltage wave 20A and clock pulses are also applied through connections from the rectifier 20 and clock 22 to a chain of data type flip flops F1, F2, F3 and F4. An AND gate 28 is connected between the outputs Q of the first and second flip flops F1 and F2 and the inputs to a second AND gate 28. The third flip flop F3 produces an 8 microsecond pulse acting as a RESET signal 4A at the end of each square wave 20A. On the next rising edge of the clock signal, the latch signal is transferred to the output of the fourth flip flop F4 to produce a RESET signal 4B which clears the counter to a value of zero.

As with the circuit of FIG. 1, the clock pulses gated during the significant portion of the FM signal cycle, i.e., the half cycle, are counted by the counter 7 which expresses the corresponding frequency modulation value in eight bit binary code applied to a register 8. The binary expressed digital output 7A of the counter and register is transmitted through a microprocessor 12 to a facsimile recorder 13.

Like the circuit of FIG. 1, the FM detector circuit of FIG. 2 determines the modulation value of the incoming signal within a fraction of a cycle rather than after several cycles as previously, and without employing components of substantial, if any, capacitance, so that capacitative delays are eliminated and an improvement is achieved in the speed and precision of the detected modulation value and in the resolution of the recording marked by the recorder.

It should be understood that the foregoing description is for the purpose of illustration only and that the invention includes all modifications and equivalents falling within the accompanying claims.

I claim:

1. Electronic apparatus for detecting the modulation value of a cyclic facsimile signal comprising:
   an input receiving the modulated cyclic signal;
   means having a response time within one signal cycle for detecting a significant portion of each signal cycle exhibiting the the modulation value to produce a gating voltage corresponding in duration to the modulation value;
   a means for generating pulses substantially higher in frequency than cycles of the input signal;
   a modulator connected to the pulse generator and detecting means and responsive thereto to gate a number of the higher frequency pulses for the duration of the gating voltage wave;
   means coupled to the modulator for counting the number of gated pulses to generate a marking signal whose amplitude is commensurate with the modulation value; and
   means coupled to the counting means for applying the marking signal to a facsimile recorder.

2. Apparatus according to claim 1 wherein the detecting means includes means determining the peak voltage amplitude of each half cycle to produce a commensurate gating voltage.

3. Apparatus according to claim 2 including a step generator of a voltage waveform tracing the half cycle to its peak amplitude value.

4. Apparatus according to claim 3 including a comparator of the half cycle voltage and the step wave and responsive thereto to generate a gating signal commensurate with the peak half cycle voltage amplitude.

5. Apparatus according to claim 4 including a feedback circuit from the comparator to the step generator causing the step generator to trace the half cycle voltage to its peak and hold the step wave at that peak voltage.

6. Apparatus according to claim 1 wherein the detecting means comprises a full wave rectifier and clipper means for producing square waves at the modulation frequency.

7. Apparatus according to claim 6 wherein the modulator is an AND gate.

8. Apparatus according to claim 1 wherein the detecting means has a response time of approximately one half a signal cycle.

9. Apparatus for detecting the amplitude value of an amplitude modulated facsimile signal comprising:
   an input receiving the amplitude modulated signal;
   means for detecting the peak amplitude of each half cycle voltage of the input signal including
   a full wave rectifier for rectifying the input signal, and
   a means for generating a step voltage waveform tracing the rectified half cycle stepwise to its peak voltage value;
   a means for generating pulses substantially higher in frequency than the cycles of the input signal;
   a means for comparing the half wave voltage and the step voltage and responsive to the step voltage to generate a gating voltage commensurate in duration to the peak value;
   a modulator connected to the pulse generator and comparator and responsive thereto to gate a number of the higher frequency pulses for the duration of the gating voltage; and
   means coupled to the modulator for counting the number of pulses to generate a marking signal of amplitude commensurate with the modulation amplitude value.

10. Apparatus according to claim 9 including a feedback circuit from the comparator to the step voltage generator causing the step generator voltage to trace the rectified half cycle to its peak and hold the step wave and gating voltage at that peak.

11. Electronic apparatus for detecting the frequency of a frequency modulated facsimile signal comprising:
an input receiving the frequency modulated signal;
a full wave rectifier and clipper for rectifying and dipping each signal cycle producing square wave signals at the modulation frequency;
a means for generating pulses substantially higher in frequency than the input signal;
a modulator connected to the pulse generator and rectifier and responsive thereto to gate a number of the higher frequency pulses for the duration of the square wave signals; and
means coupled to the modulator for counting the number of gated pulses to generate a marking signal whose amplitude is commensurate with the modulation frequency.

12. Apparatus according to claim 11 wherein the modulator is a logical AND gate.

* * * * *